US007102352B2

(12) United States Patent
Hinks et al.

(10) Patent No.: US 7,102,352 B2
(45) Date of Patent: Sep. 5, 2006

(54) METHOD AND SYSTEM FOR IMAGE ARTIFACT REDUCTION USING NEAREST-NEIGHBOR PHASE CORRECTION FOR ECHO PLANAR IMAGING

(75) Inventors: Richard Scott Hinks, Waukesha, WI (US); Bryan James Mock, Lake Mills, WI (US); Bruce David Collick, Madison, WI (US); Frederick Joseph Frigo, Waukesha, WI (US); Tejaswini Shubhachint, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/083,269

(22) Filed: Mar. 17, 2005

(65) Prior Publication Data

US 2006/0066307 A1    Mar. 30, 2006

Related U.S. Application Data

(60) Provisional application No. 60/615,208, filed on Sep. 30, 2004.

(51) Int. Cl.
*G01V 3/00* (2006.01)
(52) U.S. Cl. .................................. 324/318; 324/309
(58) Field of Classification Search .............. 324/309, 324/307, 318, 319, 300, 322; 600/410, 422
See application file for complete search history.

(56) References Cited

U.S. PATENT DOCUMENTS

| 5,151,656 | A | | 9/1992 | Maier et al. |
| 5,672,969 | A | | 9/1997 | Zhou et al. |
| 5,689,186 | A | * | 11/1997 | Maier et al. ................. 324/309 |
| 6,160,397 | A | * | 12/2000 | Washburn et al. ........... 324/309 |
| 6,239,599 | B1 | * | 5/2001 | Zhou et al. .................. 324/309 |
| 6,259,250 | B1 | | 7/2001 | Mock |
| 6,323,646 | B1 | * | 11/2001 | Zhou et al. .................. 324/309 |
| 6,836,113 | B1 | * | 12/2004 | Zhang ......................... 324/307 |
| 6,933,720 | B1 | * | 8/2005 | Zhang ......................... 324/309 |

OTHER PUBLICATIONS

Ahn et al., *A New Phase Correction Method in NMR Imaging Based on Autocorrelation and Histogram Analysis*, IEEE Transaction on Medical Imaging, vol. MI-6, No. 1, Mar. 1987, pp. 32-36.
Grieve et al., *Elimination of Nyquist Ghosting Caused by Read-Out to Phase-Encode Gradient Cross-Terms in EPI*, Magnetic Resonance in Medicine 47:337-343 (2002), pp. 337-343.
Roemer et al., *The NMR Phased Array*, Magnetic Resonance in Medicine 16 (1990), pp. 192-225.
Pruessmann et al., *SENSE: Sensitivity Encoding for Fast MRI*, Magnetic Resonance in Medicine 42-952-962 (1999), pp. 952-962.

* cited by examiner

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

A nearest neighbor phase correction technique is implemented to reduce image artifacts due to phase errors in data acquired in an EPI scan. Image quality for EPI applications, such as DWI, DTI, and fMRI, is improved.

28 Claims, 5 Drawing Sheets

METHOD AND SYSTEM FOR IMAGE ARTIFACT REDUCTION USING NEAREST-NEIGHBOR PHASE CORRECTION FOR ECHO PLANAR IMAGING

CROSS-REFERENCE TO RELATED APPLICATION

The present invention claims the benefit of U.S. Provisional Application Ser. No. 60/615,208 filed Sep. 30, 2004.

BACKGROUND OF THE INVENTION

The present invention relates generally to magnetic resonance (MR) imaging and, more particularly, to a method of image artifact reduction using nearest-neighbor phase correction.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Echo Planar Imaging (EPI) is used for many MR imaging applications, including Diffusion Weighted Imaging (DWI), Diffusion Tensor Imaging (DTI), and functional Magnetic Resonance Imaging (fMRI), because of its ability to rapidly acquire diagnostic images. Echo Planar Imaging relies on bi-polar magnetic gradient fields to acquire MR data. More particularly, EPI is a rapid imaging technique that records an entire image in a repetition interval or TR period. An EPI pulse sequence is generally characterized by a 90° slice selective RF pulse that is applied in conjunction with a slice selection gradient. An initial phase encoding gradient pulse and an initial frequency encoding gradient pulse is used to position spins at a corner of k-space, the matrix that is used to define the relative position of acquired signals along a phase encoding and a frequency encoding direction. A 180° pulse is then applied. Typically, this 180° pulse is not slice selective. The phase and frequency encoding directions are then cycled using phase encoding and readout pulses so as to transverse k-space. In this regard, a frequency encoding gradient follows a phase encoding gradient to record a time signal. Another phase encoding gradient is then applied followed by a reverse polarity frequency gradient during which another time signal is recorded. This cycling continues until k-space is filled. Because k-space can be rapidly traversed in this fashion, images can be acquired at a rate tantamount to video rates, e.g. 15–30 images per second, or faster.

EPI has been successfully used for a number of clinical applications, and is particularly useful in studies involving the human brain. DWI and DTI are imaging sequences that can be used to obtain useful diagnostic information, e.g. localization of areas damaged by ischemia or hemorrhagic stroke, creation of anisotropic diffusion coefficient (ADC) maps, enhanced anisotropic diffusion coefficient (eADC) maps, and tractography images.

Another important EPI application is fMRI of the brain. Brain fMRI is an imaging technique that relates functional activity occurring in specific locations of the brain to various stimuli, such as speech, motor functions, or visual stimulus. With fMRI it is possible to measure momentary increases in blood flow to specific thought or motor control centers that occur in response to a stimulus. For example, in response to movement of the right index finger, a rapid momentary increase in blood circulation of the specific part of the brain controlling finger movement occurs. Such an increase in blood circulation also yields an increase in oxygen which is paramagnetic and thus affects spin-lattice and spin-spin relaxation times of local brain tissues. These differences in relaxation times manifest themselves as variations in image contrast and can then be exploited with EPI to measure brain function.

A drawback of EPI is that phase errors that lead to image artifacts when not removed from the raw data may be introduced during data acquisition. EPI sequences use a single RF pulse followed by multiple data acquisition windows to encode multiple frames of MR data per RF excitation. While this speeds the rate of data collection, EPI data contains phase errors that result in "Nyquist" ghosting in the phase encoding direction. For a single-shot EPI data collection, Nyquist ghosting manifests itself as an artifact resembling the original image shifted and split in the phase direction.

A number of processes have been developed to correct for these phase errors. Known processes are predicated upon the acquisition of non-phase-encoded reference data, determining phase errors in the reference data, and correcting phase-encoded data based on the phase errors present in the reference data. While these processes have been fruitful in reducing phase errors in EPI, there still remains a need for further improvement in phase error reduction with EPI.

It would therefore be desirable to have a system and method capable of correcting phase errors in EPI acquired MR data to reduce image artifacts in reconstructed images.

BRIEF DESCRIPTION OF THE INVENTION

The present invention is directed to a process of phase error correction that overcomes the aforementioned drawbacks.

The process determines phase errors based on subtracting neighboring frames of non-phase-encoded data collected during a reference scan, and determining a first-order fit to the phase of the subtracted data. The first-order fit is then applied to phase-encoded data to reduce phase errors in the phase-encoded data. The process is particularly applicable to EPI and EPI-based scanning techniques, such as fMRI, DTI, and DWI.

The present invention is directed to an MR imaging apparatus having a plurality of gradient coils positioned about a bore of a magnet to impress a polarizing magnetic field and an RF transceiver system and an RF switch controlled by a pulse module to transmit RF signals to an RF coil assembly to acquire MR images. The apparatus also has a computer programmed to acquire frames of reference MR data and characterize each frame of reference MR data as one of an even reference frame collected with positive gradient readout polarity and an odd reference frame collected with negative readout polarity. The computer is also programmed to determine phase correction coefficients from a phase difference between adjacent even and odd reference frames, and perform an EPI scan to acquire phase-encoded MR data. The computer is further programmed to apply phase correction to the phase-encoded MR data during image reconstruction to reduce image artifacts due to phase errors in the phase-encoded MR data.

The present invention also includes a method of echo planar imaging. The method includes acquiring frames of non-phase-encoded MR data and generating a set of phase correction coefficients. The method includes time re-ordering for MR data collected with negative gradient polarity, re-sampling each data frame if data was acquired on a gradient ramp, data apodization, Fourier transformation, and phase computation for each frame of data. The method further includes computation of phase difference data from neighboring odd and even frames of non-phase-encoded MR data. The method also determines the average phase term from the set of phase difference data and then removes this linear phase term from the set of phase difference data. The method also includes determining the phase of the set of phase difference data with the linear phase term removed to effectively provide phase unwrapping, and summing the average linear phase to the unwrapped phase. The method then determines at least one phase correction coefficient from this data set. The method further includes the steps of acquiring phase-encoded MR data and applying the at least one phase correction coefficient to the phase-encoded MR data during image reconstruction to reduce image artifacts due to phase errors in the phase-encoded MR data.

The invention may also be embodied in a computer readable storage medium having a computer program stored thereon and representing a set of instructions is disclosed that when executed by a computer causes the computer to disable a phase encoding gradient coil assembly and then acquire odd and even frames of reference MR data. The computer is further caused to generate a set of phase difference MR data from phase differences between adjacent odd and even frames of reference MR data and determine at least one phase correction coefficient from the set of phase difference MR data. The computer is then caused to enable the phase encoding gradient coil assembly and acquire phase-encoded MR data. Phase correction is then applied to the acquired phase-encoded MR data during image reconstruction to correct for phase errors in the phase-encoded MR data.

Therefore, in accordance with one aspect of the present invention, an MRI system has a plurality of gradient coils positioned about a bore of a magnet to impress a polarizing magnetic field and an RF transceiver system and an RF switch controlled by a pulse module to transmit RF signals to an RF coil assembly to acquire MR images. The MRI system also has a computer programmed to acquire frames of reference MR data and characterize each frame of reference MR data as one of an even reference frame and an odd reference frame. The computer is further programmed to determine phase correction coefficients from a phase difference between adjacent even and odd reference frames and perform an EPI scan to acquire phase-encoded MR data. The computer is also programmed to apply phase correction to the phase-encoded MR data during image reconstruction to reduce image artifacts due to phase errors in the phase-encoded MR data.

In accordance with another aspect, the invention includes a method of echo planar imaging that includes the steps of acquiring frames non-phase-encoded MR data from positive and negative readout gradient polarities and generating a set of phase difference data from neighboring frames of non-phase-encoded MR data acquired with positive and negative readout gradient polarity. The method further includes determining an average linear phase term from the set of phase difference data and removing the average linear phase term from the set of phase difference data. The phase of the set of phase difference data with the linear phase term removed for phase unwrapping is then determined. The method further includes the steps of restoring the average linear phase term to the determined phase to yield an unwrapped phase component and determining at least one phase correction coefficient from the unwrapped phase component. Phase-encoded MR data is acquired whereby phase correction is applied to the phase-encoded MR data to reduce phase errors in the phase-encoded MR data.

According to another aspect, the present invention includes a computer readable storage medium having a computer program stored thereon and representing a set of instructions that when executed by a computer causes the computer to disable a phase encoding gradient coil assembly, and acquire odd and even frames of reference MR data with the phase encoding gradient coil assembly disabled. The computer is further caused to generate a set of phase difference MR data from phase differences between adjacent odd and even frames of reference MR data and determine a set of phase correction coefficients from the phase difference MR data. The set of instructions further causes the computer to enable the phase encoding gradient coil assembly and acquire phase-encoded MR data. The set of phase correction coefficients is then applied to the acquired phase-encoded MR data to correct for phase errors in the phase-encoded MR data.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
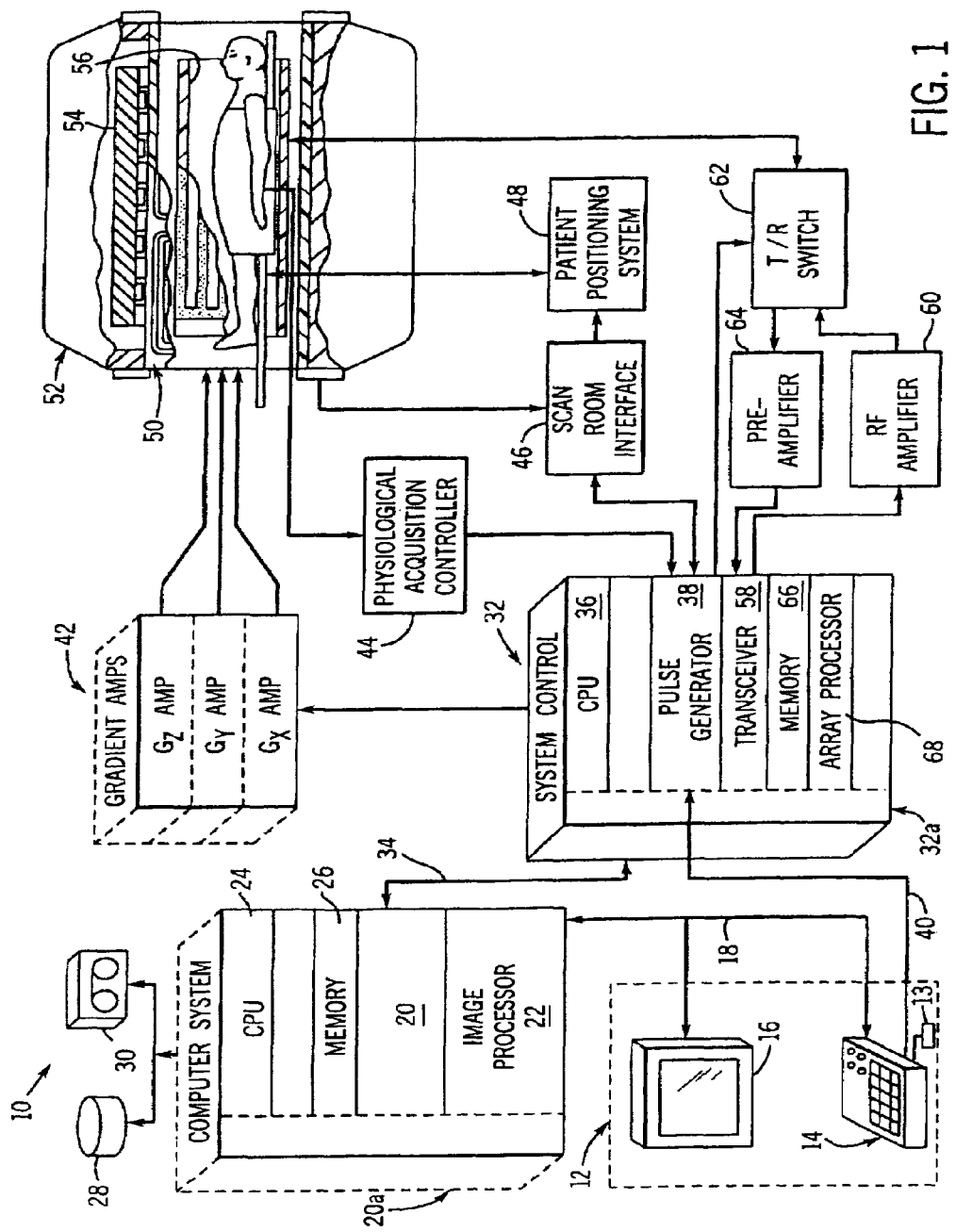
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode. System 10 may also be equipped with a phased array coil for parallel acquisitions.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a process of image reconstruction of EPI raw data that may be carried out with the MR imaging system illustrated in FIG. 1, or equivalent thereof. Frames of reference scan data are collected prior to an EPI scan and processed to determine a set of constant and linear phase correction coefficients for each frame of data. The new phase correction coefficients are then used to remove phase errors included with the EPI MR raw data to reduce image artifacts. Extensive testing with both 1.5 T and 3.0 T MR systems has shown significant benefit of the present invention. While the invention will be described with respect to steps of a process or method, one skilled in the art will readily appreciate the present invention may be embodied in instructions of a computer program that when executed by a computer carries out the phase error correction processes described herein.

Figure 2:
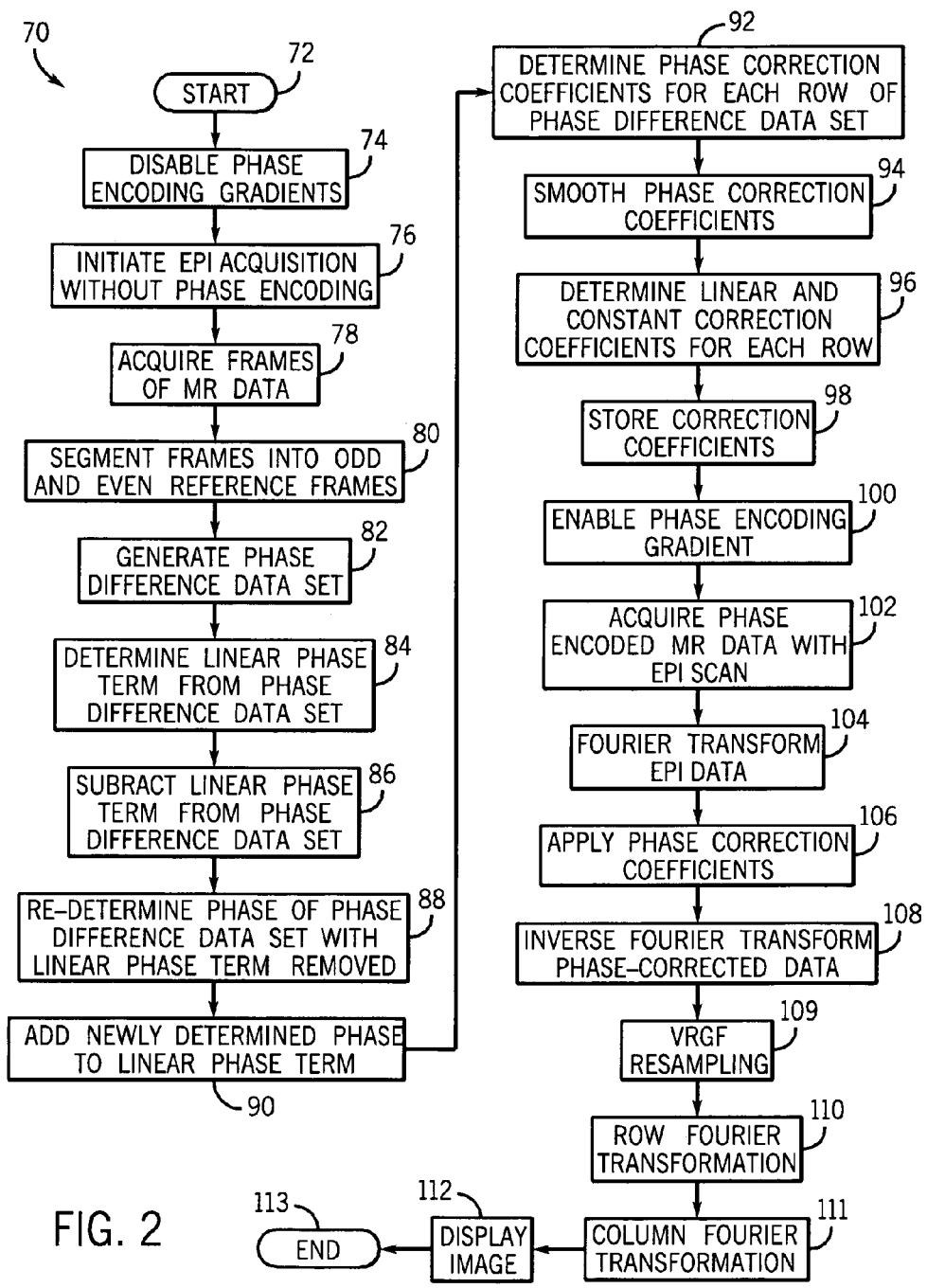
FIG. 2 is a flow chart setting forth the steps an MR data acquisition and phase correction process in accordance with one embodiment of the present invention.

Referring now to FIG. 2, the steps of an MR data acquisition process are illustrated. Process 70 is designed to acquire non-phase-encoded MR data, determine phase correction coefficients from the non-phase-encoded or reference MR data, and then apply the phase error correction coefficients to acquired phase-encoded MR data during image reconstruction to reduce image artifacts arising from phase errors. Process 70 is particularly well-suited for EPI scans which typically employ a phase error correction, but may also be applicable with other scan protocols. Additionally, process 70 may be used for single-shot as well as multi-shot MR data acquisitions.

Process 70 begins at 72 with the prescription of an EPI scan, such as fMRI acquisition, and positioning of the subject for scanning. Prior to acquiring imaging data, reference data is acquired. This reference data is acquired without phase encoding. As such, the gradient coil assembly responsible for phase encoding is disabled at 74 whereupon the EPI acquisition of non-phase encoding data is initiated at 76. It is contemplated that a number of EPI pulse sequences may be used for the acquisition of the non-phase-encoded reference data. Additionally, it is preferred that the reference data is collected with the same measurement parameters that will used to acquire phase-encoded imaging data.

Consistent with the applied EPI scan, frames or k-space rows of reference data is acquired at 78. The frames are then segmented into odd and even frames 80 corresponding to whether the frames were collected with positive readout gradient polarity (odd) or negative readout gradient polarity (even). In this regard, each frame or row of k-space is designated as either an odd row or an even row. Further, for single-shot EPI, k-space is constructed to have alternating odd and even rows. Once the ramp-sampled EPI MR data has been acquired in step 78, frames of MR raw data collected with negative gradient polarity must be time-reversed. In this regard, VRGF re-sampling is not performed on the non-phase-encoded EPI reference data. Next, the Fourier transform of each row of k-space is performed. After the Fourier transform, the phase of each element in k-space may be computed. A phase difference data set is then generated. For single-shot EPI this is done by subtracting adjacent odd and even rows of MR phase data. For multiple-shot EPI, adjacent frames of MR raw data in k-space acquired with the same gradient polarity are averaged together to form a reduced set of M frames of data from which phase difference data sets will be generated. Specifically, the phase difference dataset is generated at 82 by subtracting the phase of adjacent odd-even frames or rows of k-space. For M frames of data, M−1 rows of phase difference data is generated. Phase subtraction may be implemented by multiplying each frame by the complex conjugate of the next frame as indicated in Eqn. 1:

$$pdiff_m[n]=r_m[n]*r^*_{m+1}[n] \text{ for } n=0,1,\ldots,N-1 \text{ and}$$
$$m=0,1,\ldots,M-2 \quad \text{(Eqn. 1),}$$

with the phase difference between adjacent rows defined by:

$$\phi_m[n] = \arctan\left(\frac{\text{Re}(pdiff_m[n])}{\text{Im}(pdiff_m[n])}\right) \text{ for } n = \quad \text{(Eqn. 2)}$$
$$0, 1, \cdots, N-1 \text{ and } m = 0, 1, \cdots, M-2,$$

and the magnitude of the nearest neighbor subtraction given by:

$$\rho_m[n]=|pdiff_m[n]| \text{ for } n=0,1,\ldots,N-1 \text{ and}$$
$$m=0,1,\ldots,M-2 \quad \text{(Eqn. 3)}$$

From the phase difference dataset, a linear phase term is determined at 84. This linear phase term is computed by summing all real values in the phase difference dataset and all imaginary values in the phase difference dataset, then taking the arctangent to compute the phase, as set forth in Eqn. 4:

$$\phi_{ahn} = \arctan\left(\frac{\text{Re}\left(\sum_{m=0}^{M-2}\sum_{n=0}^{N-2} pdiff_m[n] * pdiff^*_m[n+1]\right)}{\text{Im}\left(\sum_{m=0}^{M-2}\sum_{n=0}^{N-2} pdiff_m[n] * pdiff^*_m[n+1]\right)}\right). \quad \text{(Eqn. 4)}$$

The linear phase term, as determined from Eqn. 4, is then subtracted from the phase difference dataset at 86 as follows. Given:

$$\text{ramp}[n] = n - \frac{N}{2} \text{ for } n = 0, 1, \cdots, N-1, \quad \text{(Eqn. 5)}$$
and
$$\phi_{ahn\_row}[n] = \phi_{ahn} * \text{ramp}[n] \text{ for } N = 0, 1, \cdots, N-1, \quad \text{(Eqn. 6)}$$

then the linear phase component can be removed for each row (m) by:

$$\psi_m[n]=\phi_m[n]-\phi_{ahn\_row}[n] \text{ for } n=0,1,\ldots,N-1 \text{ and}$$
$$m=0,1,\ldots,M-2 \quad \text{(Eqn. 7).}$$

With the linear phase component removed from each row of the phase difference dataset 86, the phase of the phase difference dataset is then recalculated, or otherwise re-determined, at 88 to perform phase unwrapping. The phase of the phase difference dataset with the removed linear phase component may be defined by:

$$\psi_m[n] = \tan^{-1}\left(\frac{\cos(\psi_m[n])}{\sin(\psi_m[n])}\right) \text{ for } n = 0, 1, \quad \text{(Eqn. 8)}$$
$$\ldots, N-1 \text{ and } m = 0, 1, \cdots, M-2.$$

After step 88, the phase will be defined by:

$$-\pi \leq \psi_m[n] \leq \pi \text{ for } n=0,1,\ldots,N-1 \text{ and}$$
$$m=0,1,\ldots,M-2 \quad \text{(Eqn. 9).}$$

In a preferred embodiment of the invention, process 90 restores the linear phase component prior to a weighted least-squares fit. In this regard:

$$\psi_m[n]=\psi_m[n]+\phi_{ahn\_row}[n] \text{ for } n=0,1,\ldots,N-1 \text{ and}$$
$$m=0,1,\ldots,M-2 \quad \text{(Eqn. 10).}$$

As referenced above, the present invention employs a weighted least-squares fit to provide a first-order characterization of phase errors occurring during EPI reference scan data acquisition in order to remove phase errors in EPI acquired scan data. As such, following step 90, phase correction coefficients for the weighted least-squares fit are determined at 92 for each row or frame of the phase difference dataset. In this regard, a first-order fit is determined by:

$$\psi_m[n]=(a_m*\text{ramp}[n])+b_m+\epsilon_m \text{ for } n=0,1,\ldots,N-1$$
$$\text{and } m=0,1,\ldots,M-2 \quad \text{(Eqn. 11),}$$

where $\epsilon_m$ is the error term (minimized using a weighted least squares technique) determined from the unwrapped phase difference, $\psi_m[n]$, as determined from Eqn. (10), and the magnitude of the nearest neighbor subtraction, $\rho_m[n]$, as determined from Eqn. (3).

The phase correction coefficients are interpolated from the results of the weighted least-squares fit of the phase difference data. Given that there are only M−1 rows of phase difference data, the first and the last row of phase difference coefficients are duplicated to form a set of M−1 coefficients. Specifically:

$$\alpha_0=a_0$$
$$\alpha_{m+1}=a_m \text{ for } m=0,1,\ldots,M-2$$
$$\alpha_M=a_{M-2} \quad \text{(Eqn. 12);}$$
$$\beta_0=b_0$$
$$\beta_{m+1}=b_m \text{ for } m=0,1,\ldots,M-2$$
$$\beta_M=B_{M-2} \quad \text{(Eqn. 13).}$$

This set of linear ($\alpha_m$) and constant ($\beta_m$) coefficients can then be smoothed at 94 using one of a number of smoothing functions. In the preferred embodiment, an infinite impulse response (IIR) type filter with quadratic smoothing properties is used, however other conventional smoothing filters maybe used.

Following smoothing of the linear and constant correction coefficients at 94, linear and constant phase correction coefficients are determined for each row of the phase difference dataset at 96. The linear phase correction coefficients for each row are determined by:

$$lin_m = (-1^m)\frac{\alpha_m + \alpha_{m+1}}{2} \text{ for } m = 0, 1, \cdots, M-1, \quad \text{(Eqn. 14)}$$

and the constant phase correction coefficients are determined by:

$$con_m = (-1^m)\frac{\beta_m + \beta_{m+1}}{2} \text{ for } m = 0, 1, \cdots, M-1. \quad \text{(Eqn. 15)}$$

The determined linear and constant phase correction coefficients are then stored in volatile memory and saved to computer storage media to be used to correct phase-encoded EPI data prior to image reconstruction.

Following determination of the phase correction coefficients, process 70 continues with enablement of the phase encoding gradient coil assembly at 100. In this regard, during EPI imaging data acquisition, phase-encoded MR data is acquired at 102. Once the ramp-sampled EPI MR data has been acquired in step 102, frames of MR raw data collected with negative gradient polarity must be time-reversed. Then, phase correction is performed on the ramp-sampled data by first performing a Fourier transformation on the ramp-sampled data 104. After the Fourier transform 104, phase correction is applied 106 to adjust the phase for each data point in the row in accordance with Eqns. 16–18 below:

$\chi[n]=(\text{ramp}[n] \cdot lin_m) + con_m$ for $n=0,1,\ldots,N-1;$
$m=0,1,\ldots,M-1$ (Eqn. 16), phase_$corr_m[n]=\cos(\chi[n])+i\sin(\chi[n])$ (Eqn. 17), and $r_{m\_corrected}[n]=r_m[n] \cdot \text{phase}\_corr[n]$ Eqn. (18).

By applying phase correction during image reconstruction, the phase of each data point in the row is adjusted in such a manner as to reduce artifacts in the image resulting from phase errors. This phase adjustment is continued for each row of the row transformed data. The phase corrected data (after Eqn. 18) undergoes a subsequent inverse Fourier transformation to return the data to the time domain 108. Then, VRGF re-sampling is performed 109 after phase correction for each row of MR data. Next, each row of MR data is Fourier transformed 110 in the conventional manner. After all rows have been Fourier transformed 110, each column undergoes a Fourier transform 111 whereupon an image is reconstructed and displayed at 112, and process 70 ends at 113.

In addition to the phase error correction technique described with respect to the process of FIG. 2, the present invention is also directed to a VRGF re-sampling technique also designed to improve image quality during EPI reconstruction. VRGF re-sampling is a time domain dependent interpolation process that is carried out to re-sample raw data collected with variable readout gradients (ramp-sampling). VRGF re-sampling typically uses discrete-time convolution to transform data acquired during gradient transitions into uniformly sampled data typical of that acquired during gradient steady-state. Moreover, VRGF re-sampling is conventionally applied before phase correction. As a result, phase errors that are present in the raw, acquired MR data may not be suitable for phase correction. These phase errors are particularly well-pronounced when EPI data is acquired with poorly calibrated MR systems. Notwithstanding the advantages achieved with conventional VRGF re-sampling, performing phase correction before VRGF re-sampling can be error prone, and is generally inefficient if a system is not calibrated sufficiently to provide proper echo alignment between data collected with positive and negative readout gradient polarity. Accordingly, the present invention is also directed to an EPI reconstruction technique whereby phase correction occurs before VRGF re-sampling to make phase correction less sensitive to echo alignment deficiencies that may exist in a poorly calibrated system.

Figure 3:
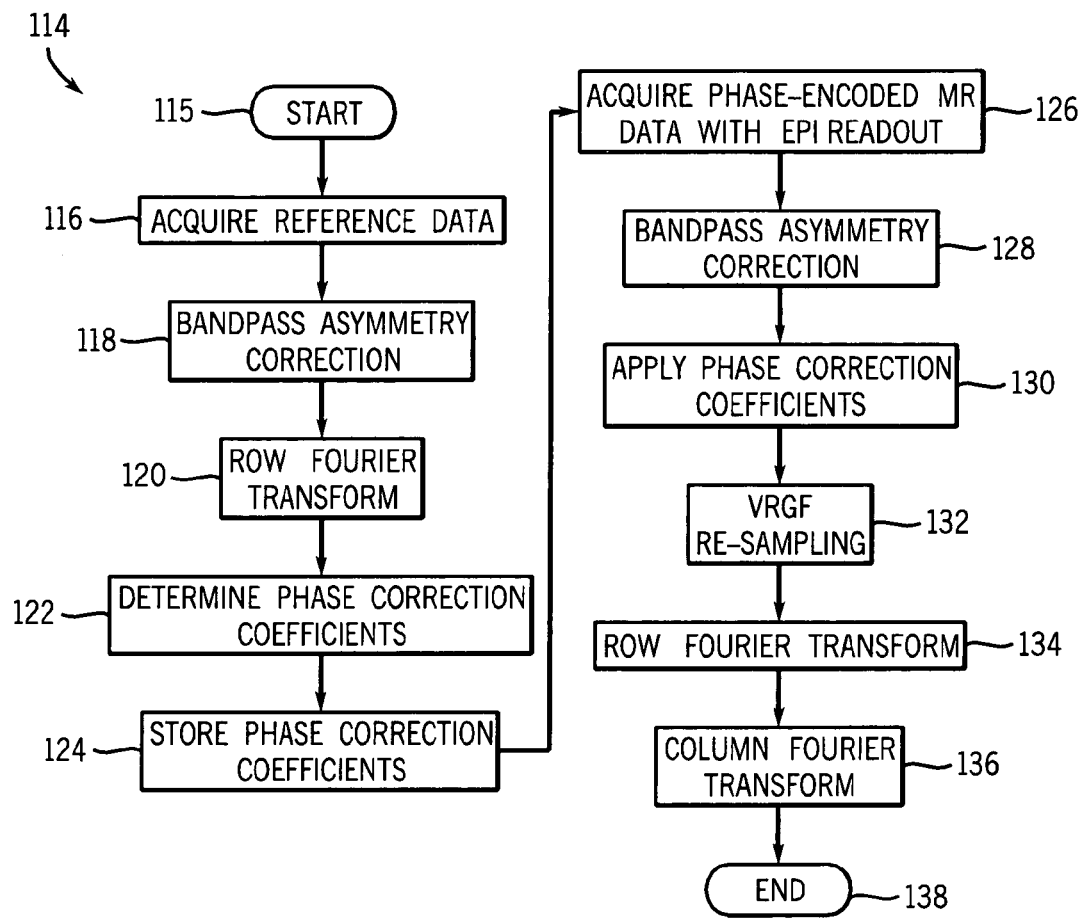
FIG. 3 is a flow chart setting forth the steps of a Variable Readout Gradient Filtering (VRGF) technique in accordance with another embodiment of the present invention.

Referring now to FIG. 3, process 114 sets forth the steps of an EPI reconstruction technique in accordance with another embodiment of the invention. Process 114 begins at 115 with the prescription of an EPI scan. Reference, non-phase-encoded, ramp-sampled MR data is then acquired at 116 in a manner similar to that described with respect to FIG. 2. Bandpass asymmetry correction may then be performed at 118 to correct for the effects of asymmetrical filter response on the MR data. The bandpass asymmetry corrected data is then row Fourier transformed (without re-sampling) 120 and phase correction coefficients are determined, or otherwise calculated, at 122. The phase correction coefficients are preferably determined in accordance with the technique described above with respect to FIG. 2 and Eqns. 1–18. The determined phase correction coefficients are then stored in memory and saved to computer media at 124 and will be used for phase correction during EPI reconstruction.

After the phase correction coefficients have been determined and stored, phase-encoded, ramp-sampled EPI data is acquired at 126 consistent with the parameters of the MR session defined at 114. Similar to the acquired reference data, the EPI data may also be bandpass asymmetry corrected in a conventional manner to correct for asymmetries at 128. The MR raw data is then Fourier transformed and the stored phase correction coefficients are then applied to the data 130. The phase correction coefficients are applied to reduce phase errors that are typically encountered during EPI. Next, the phase corrected data is then inverse Fourier transformed, completing the phase correction step 130.

After the step of phase correction 130, the phase corrected data is subjected to VRGF re-sampling. The phase corrected data is re-sampled using one of a number of known VRGF re-sampling techniques. The re-sampled data is then row and column Fourier transformed at 134 and 136, respectively, to reconstruct an image at 138, whereupon process 112 ends. As described above and in contrast to known EPI reconstruction processes, VRGF re-sampling is carried out after phase correction. In this regard, phase errors in the raw data are reduced prior to re-sampling. This is especially evident for poorly calibrated systems where echo alignment between frames of data collected with positive and negative gradient readout polarity varies significantly.

Figure 5:
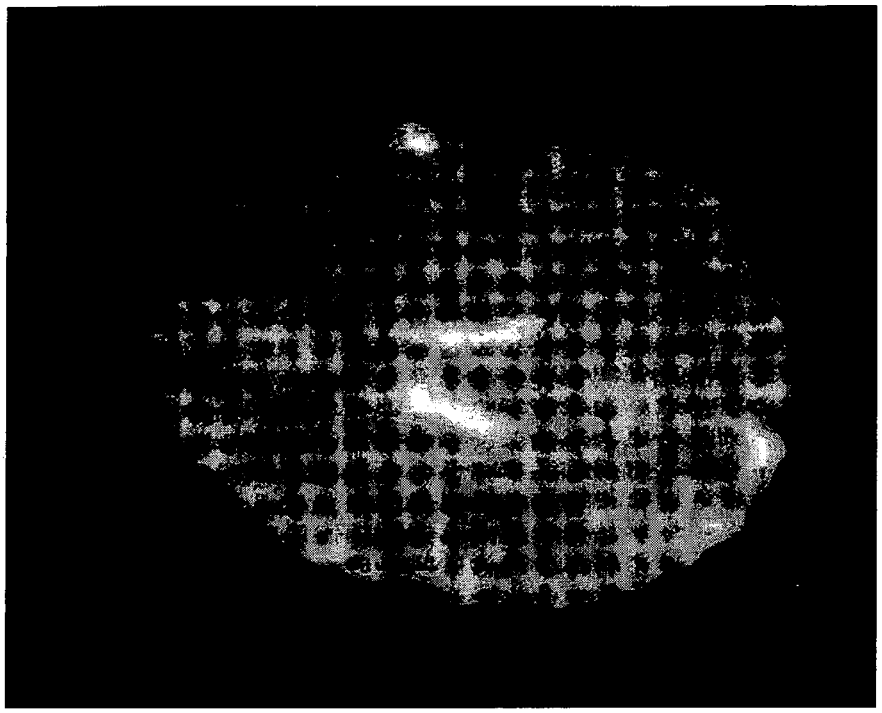
FIG. 5 is an image of the same human brain as shown in FIG. 4 reconstructed from EPI data acquired with the data acquisition and phase correction process illustrated in FIG. 2 and the VRGF re-sampling technique illustrated in FIG. 3.
Figure 4:
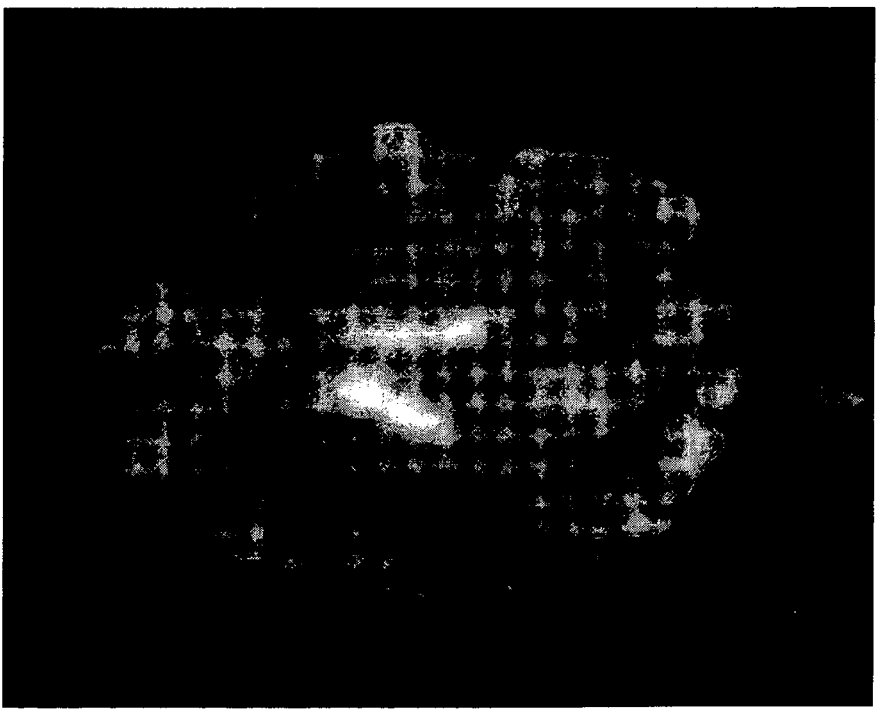
FIG. 4 is an image of a human brain reconstructed from EPI data acquired with a known EPI reconstruction technique.

The robustness of the phase correction and VRGF re-ordering processes described with respect to FIGS. 2 and 3 is illustrated in the images of FIGS. 4 and 5. FIGS. 4 and 5 correspond to images acquired of a phantom from data acquired with a single shot EPI scan having an echo time (TE) of 50 milliseconds, a TR of 2000 milliseconds, a field-of-view (FOV) of 24 centimeters, a slice thickness of 5 millimeters, a 64×64 k-space matrix, 1 NEX, and ramp sampling. FIG. 4 is an image that illustrates the edge ghosting and other phase error artifacts that can be experienced using conventional EPI reconstruction techniques. FIG. 5, on the other hand, is an image reconstructed from EPI data acquired, phase corrected, and re-sampled consistent with the processes described with respect to FIGS. 2 and 3. As shown, in the image of FIG. 5 the ghosting present in the image of FIG. 4 has been removed. Thus, the image of FIG. 5 has better image quality when compared to the image of FIG. 4.

A drawback of post-phase correction VRGF re-sampling, however, is that the Fourier transform must be performed on a larger dataset. Then, after phase correction, an inverse Fourier transform must be carried out so that the VRGF re-sampling can be performed in the time domain. As a result, the computational requirements of the process can be burdensome. In this regard, the present invention is also directed to an EPI reconstruction technique that performs VRGF before phase correction in a conventional manner, but also reduces phase errors to a degree not feasible with conventional EPI reconstruction techniques.

Figure 6:
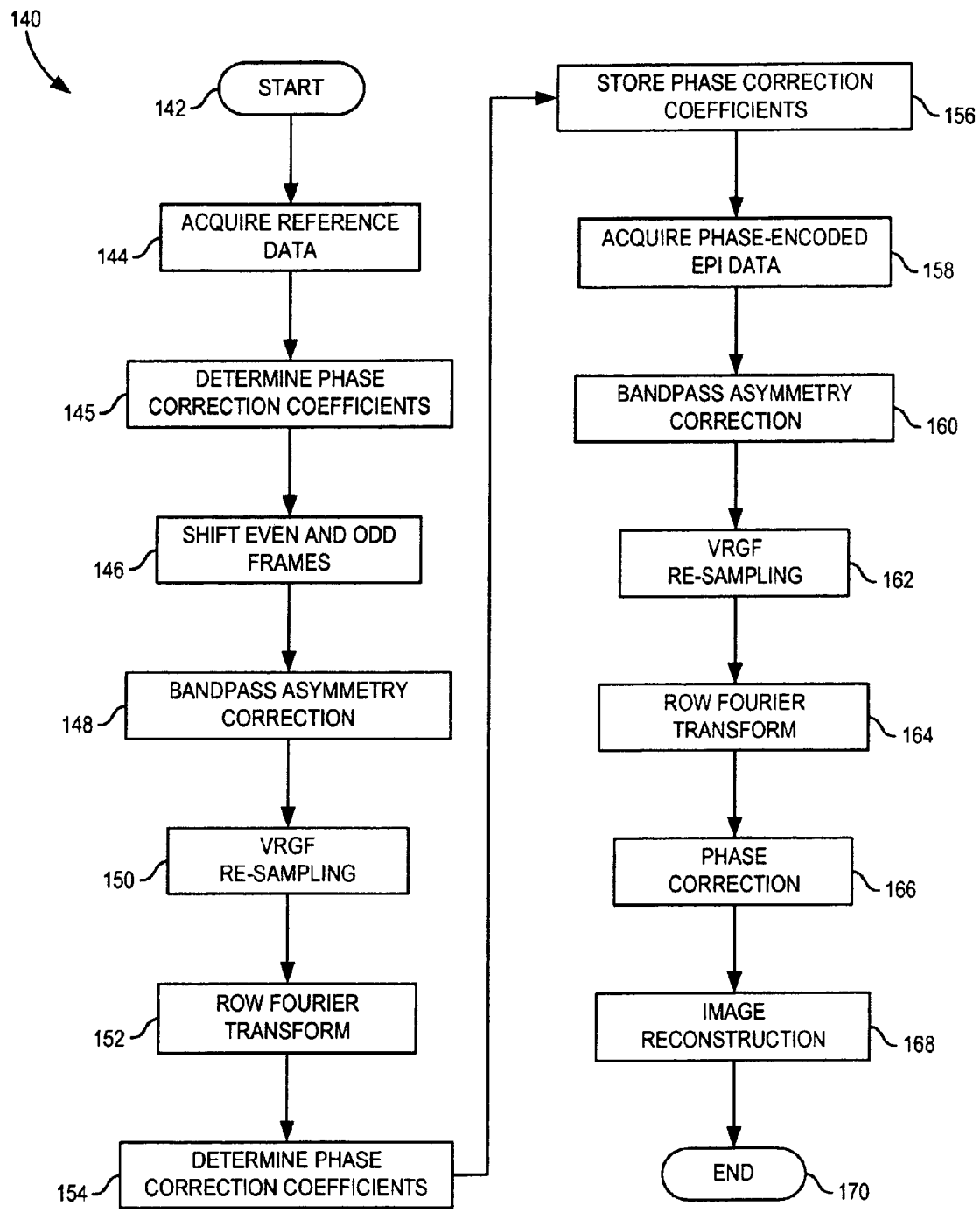
FIG. 6 is a flow chart setting forth the steps of an EPI reconstruction utilizing VRGF re-sampling with shifted/re-aligned reference data in accordance with another embodiment of the present invention.

Referring now to FIG. 6, process 140 begins at 142 with the prescription of an EPI scan to acquire ramp-sampled MR data from a subject, such as a brain image using fMRI. Prior to the acquisition of imaging data, reference data that lacks phase encoding is acquired at 144. Phase correction coefficients are then determined at 145 in accordance with the phase correction coefficient determination process described with respect to FIG. 2 and Eqns. 1–18 with no VRGF re-sampling applied to the MR data. The phase correction coefficients are then used to determine appropriate shift parameters. Specifically, the linear phase correction coefficients for all views (frames or rows) of data collected with negative polarity gradients are averaged together to yield an average linear phase correction term for negative views, $\gamma_n$. Similarly, the linear phase correction coefficients for all views of data acquired with positive polarity gradients are averaged together to form an average linear phase correction term for positive views, $\gamma_p$. The $\gamma_n$ and $\gamma_p$ parameters are used to determine the appropriate amount of shifting in the time domain to be done on the raw data prior to EPI reconstruction for frames of data collected with negative and positive polarity gradients, respectively. The odd and even frames of reference data are then shifted at 146 based on the $\gamma_n$ and $\gamma_p$ parameters as shown below.

$$\gamma_p \propto \delta_p$$

$$\gamma_n \propto \delta_n$$

where $\{\delta_p, \delta_n\}$ are integers.
For negative gradient readout polarity:

$$k_m[n] = \begin{cases} k_{negative}[n+\delta_n] & \text{for } 0 \le n+\delta_n < N \\ 0 & \text{otherwise} \end{cases} \text{ for } 0 \le n < N. \quad \text{(Eqn. 19)}$$

For positive gradient readout polarity:

$$k_m[n] = \begin{cases} k_{positive}[n+\delta_p] & \text{for } 0 \le n+\delta_p < N \\ 0 & \text{otherwise} \end{cases} \text{ for } 0 \le n < N. \quad \text{(Eqn. 20)}$$

A second pass is then made through the reference data whereupon the shifted data is then bandpass asymmetry corrected at 148 to correct for asymmetries followed by VRGF re-sampling 150. In this regard, VRGF re-sampling takes place prior to phase correction, but is applied to time-shifted or re-aligned raw data. Shifting the data effectively performs crude echo alignment between data frames collected with positive and negative gradient polarity. The re-sampled data is then row Fourier transformed 152 and new phase correction coefficients are determined at 154. Preferably, the new phase correction coefficients are determined in accordance with the steps described with respect to FIG. 2 and Eqns. 1–18. The new phase correction coefficients are then stored in volatile memory and saved to computer storage media at 156 for subsequent use during EPI reconstruction.

Once the new phase correction coefficients have been determined, phase-encoded EPI data is acquired at 158. The phase-encoded data is then bandpass asymmetry corrected to correct for asymmetries at 160. VRGF re-sampling is then carried out to re-sample data acquired during gradient transitions. The re-sampled data is then row Fourier transformed at 164 followed by application of the phase correction coefficients at 166 to correct for phase errors in the phase-encoded EPI data. Following phase correction, an image is reconstructed and displayed (and/or stored) in a conventional manner at 168, whereupon the process ends at 170.

The present invention is applicable to single and multi-channel reconstruction where data from each channel is processed independently and then combined using a sum of the squares technique. The present invention may also be carried out for multi-channel parallel imaging techniques, such as SENSetivity Encoding (SENSE) or Array Spatial and Sensitivity Encoding Technique (ASSET). The present invention is also applicable with EPI scans carried out at several magnetic field strengths, including, but not limited to 1.5 and 3.0 Tesla.

Moreover, it is contemplated that the non-phase-encoded MR reference data can be acquired with a multiple channel phased array coil and phase correction coefficients be determined for each channel. These phase correction coefficients are then applied to the same channel during image reconstruction of the phase-encoded data. Additionally, it is contemplated that phase correction coefficients could be determined for only one channel, and then phase correction coefficients from that channel are applied to all channels of data during image reconstruction of the phase-encoded data. In yet another embodiment, the non-phase-encoded MR reference data is acquired from one slice location and the phase correction coefficients are determined for only one slice location. In this regard, the phase correction coefficients determined from the one slice are applied to the multiple slices during image reconstruction of the phase-encoded data. In yet another embodiment, the non-phase-encoded MR reference data is acquired from multiple slice locations and the phase correction coefficients are determined for each slice location. The phase correction coefficients are then applied to the same slice location during image reconstruction of the phase-encoded data.

Therefore, the present invention includes an MR imaging apparatus having a plurality of gradient coils positioned about a bore of a magnet to impress a polarizing magnetic field and an RF transceiver system and an RF switch controlled by a pulse module to transmit RF signals to an RF coil assembly to acquire MR images. The apparatus also has a computer programmed to acquire frames of reference MR data and characterize each frame of reference MR data as one of an even reference frame and an odd reference frame. The computer is also programmed to determine phase correction coefficients from a phase difference between adjacent even and odd reference frames. The computer is further programmed to perform an EPI scan to acquire phase-encoded MR data and to apply phase correction to the phase-encoded MR data during image reconstruction to reduce phase errors in the phase-encoded MR data.

The present invention also includes a method of echo planar imaging. The method includes acquiring a set of non-phase-encoded MR data and generating a set of phase difference data from the non-phase-encoded MR data. The method also determines the average phase term from the set of phase difference data and then removes this linear phase term from the set of phase difference data. The method also includes determining the phase of the set of phase difference data with the linear phase term removed to effectively provide phase unwrapping, and summing the average linear phase to the unwrapped phase. The method then determines at least one phase correction coefficient from this data set. The method further includes the steps of acquiring phase-encoded MR data and applying phase correction to the phase-encoded MR data during image reconstruction to reduce image artifacts due to phase errors in the phase-encoded MR data.

A computer readable storage medium having a computer program stored thereon and representing a set of instructions is also disclosed that when executed by a computer causes the computer to disable a phase encoding gradient coil assembly and then acquire odd and even frames of reference MR data with the phase encoding gradient coil assembly disabled. The computer is further caused to generate a set of phase difference MR data from phase differences between adjacent odd and even frames of reference MR data and determine at least one phase correction coefficient from the set of phase difference MR data. The computer is then caused to enable the phase encoding gradient coil assembly and acquire phase-encoded MR data. Then phase correction is applied to the acquired phase-encoded MR data during image reconstruction to correct for phase errors in the phase-encoded MR data.

The present invention has been described in terms of the preferred embodiment, and it is recognized that equivalents, alternatives, and modifications, aside from those expressly stated, are possible and within the scope of the appending claims.

What is claimed is:

1. A magnetic resonance imaging (MRI) system comprising:
   a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to:
      acquire frames of reference MR data;
      characterize each frame of reference MR data as one of an even reference frame and an odd reference frame;
      determine phase correction coefficients from a phase difference between adjacent even and odd reference frames;
      perform an EPI scan to acquire phase-encoded MR data; and
      apply phase correction to the phase-encoded MR data during image reconstruction to reduce image artifacts due to phase errors in the phase-encoded MR data.

2. The MRI system of claim 1 wherein the phase-encoded MR data includes rows of MR data and wherein the phase correction coefficients include a constant term and a linear term for each row of MR data.

3. The MRI system of claim 1 wherein the computer is further programmed to apply a first-order phase correction to the phase-encoded MR data during image reconstruction.

4. The MRI system of claim 3 wherein the computer is further programmed to determine the phase correction coefficients from non-phase-encoded data by subtracting the phase of adjacent odd and even frames to generate a set of phase difference data, and determining the phase correction coefficients from the set of phase difference data.

5. The MRI system of claim 4 wherein the computer is further programmed to determine an average linear phase of the set of phase difference data by:
   summing all real values and all imaginary values in the set of phase difference data; and
   taking an arctangent of a ratio of the sum of all real values to the sum of all imaginary values.

6. The MRI system of claim 5 wherein the computer is further programmed to subtract the average linear phase term from each term of the set of phase-difference data.

7. The MRI system of claim 6 wherein the computer is further programmed to determine a phase of the set of phase-difference data with average linear phase removed to effectively provide phase unwrapping.

8. The MRI system of claim 7 wherein the computer is further programmed to re-store the removed average linear phase of the phase difference data prior to a weighted least-squares fit to obtain a first-order characterization of phase for each row of phase-difference data.

9. The MRI system of claim 4 wherein the computer is further programmed to determine a weighted first-order fit with a linear and a constant term for each row of the set of phase-difference data.

10. The MRI system of claim 9 wherein the computer is further programmed to interpolate the phase correction coefficients from the first-order fit.

11. The MRI system of claim 9 wherein the computer is further programmed to smooth the phase correction coefficients prior to applying the phase correction coefficients to the phase-encoded MR data.

12. The MRI system of claim 1 wherein the magnet is one of a 1.5T and a 3T magnet.

13. A method of echo planar imaging comprising the steps of:
   acquiring frames non-phase-encoded MR data from positive and negative readout gradient polarities;
   generating a set of phase difference data from neighboring frames of non-phase-encoded MR data acquired with positive and negative readout gradient polarity;
   determining an average linear phase term from the set of phase difference data;
   removing the average linear phase term from the set of phase difference data;
   determining the phase of the set of phase difference data with the linear phase term removed for phase unwrapping;
   restoring the average linear phase term to the determined phase to yield an unwrapped phase component;
   determining at least one phase correction coefficient from the unwrapped phase component;
   acquiring phase-encoded MR data; and
   applying phase correction to the phase-encoded MR data to reduce phase errors in the phase-encoded MR data.

14. The method of claim 13 wherein the computer is further programmed to acquire the frames of non-phase-encoded MR data in real-time with the phase-encoded MR data.

15. The method of claim 14 further comprising the step of segmenting the frames of non-phase-encoded MR data into odd reference frames and even reference frames.

16. The method of claim 15 wherein an even reference frame is adjacent to an odd reference frame with opposite readout gradient polarity.

17. The method of claim 16 wherein the step of determining the average linear phase term includes summing all real values and all imaginary values of the set of phase difference data and determining an arctangent of a ratio of the sum of real values to the sum of imaginary values.

18. The method of claim 13 further comprising the step of re-sampling acquired phase-encoded MR data acquired during gradient transitions after phase correction of the phase-encoded MR data.

19. The method of claim 13 further comprising the step of acquiring the MR data with a phased array coil assembly configured for parallel imaging.

20. The method of claim 13 further comprising the step of acquiring the phase-encoded MR data with an EPI scan.

21. The method of claim 13 further comprising the step of acquiring the non-phase-encoded MR reference data with a multiple channel phased array coil and computing phase correction coefficients for each channel, and then applying these phase correction coefficients to the same channel during image reconstruction of the phase-encoded data.

22. The method of claim 13 further comprising the step of acquiring the non-phase-encoded MR reference data with a multiple channel phased array coil and computing phase correction coefficients for only one channel, then applying the phase correction coefficients from that channel to all channels during image reconstruction of the phase-encoded data.

23. The method of claim 13 further comprising the step of acquiring the non-phase-encoded MR reference data from multiple slice locations and computing phase correction coefficients for each slice location, and then applying these phase correction coefficients to the same slice location during image reconstruction of the phase-encoded data.

24. The method of claim 13 further comprising the step of acquiring the non-phase-encoded MR reference data from one slice location and computing phase correction coefficients for only one slice location, then applying these phase correction coefficients to multiple slice locations during image reconstruction of the phase-encoded data.

25. A computer readable storage medium having a computer program stored thereon and representing a set of instructions that when executed by a computer causes the computer to:
  disable a phase encoding gradient coil assembly;
  acquire odd and even frames of reference MR data with the phase encoding gradient coil assembly disabled;
  generate a set of phase difference MR data from phase differences between adjacent odd and even frames of reference MR data;
  determine a set of phase correction coefficients from the phase difference MR data;
  enable the phase encoding gradient coil assembly;
  acquire phase-encoded MR data; and
  apply the set of phase correction coefficients to the acquired phase-encoded MR data to correct for phase errors in the phase-encoded MR data.

26. The computer readable storage medium of claim 25 wherein the set of instructions further causes the computer to acquire the phase-encoded MR data with an EPI readout.

27. The computer readable storage medium of claim 25 wherein the set of instructions further causes the computer to determine a first-order polynomial fit to the set of phase difference MR data and apply phase correction coefficients derived therefrom to the phase-encoded MR data.

28. The computer readable storage medium of claim 27 wherein the set of instructions further causes the computer to determine a constant phase correction coefficient and a linear phase correction coefficient for each k-space row of phase difference MR data.

* * * * *